(12) United States Patent
Yan et al.

(10) Patent No.: US 12,278,349 B2
(45) Date of Patent: Apr. 15, 2025

(54) BATTERY HEALTH MONITORING METHOD AND APPARATUS, AND ELECTRONIC CIGARETTE (71) Applicant: SHENZHEN FIRST UNION TECHNOLOGY CO., LTD., Shenzhen (CN)

(72) Inventors: Huiyong Yan, Shenzhen (CN); Zhongli Xu, Shenzhen (CN); Yonghai Li, Shenzhen (CN)

(73) Assignee: SHENZHEN FIRST UNION TECHNOLOGY CO., LTD., Shenzhen (CN)

( * ) Notice: Subject to any disclaimer, the term of this patent is extended or adjusted under 35 U.S.C. 154(b) by 935 days.

(21) Appl. No.: 17/293,146

(22) PCT Filed: Nov. 5, 2019

(86) PCT No.: PCT/CN2019/115748
§ 371 (c)(1),
(2) Date: May 12, 2021

(87) PCT Pub. No.: WO2020/098533
PCT Pub. Date: May 22, 2020

(65) Prior Publication Data
US 2022/0013817 A1 Jan. 13, 2022

(30) Foreign Application Priority Data

Nov. 14, 2018 (CN) .......................... 201811351097.5

(51) Int. Cl.
*H01M 10/48* (2006.01)
*A24F 40/53* (2020.01)
(Continued)

(52) U.S. Cl.
CPC ............. *H01M 10/48* (2013.01); *A24F 40/53* (2020.01); *A24F 40/60* (2020.01); *H01M 10/44* (2013.01); *H02J 7/005* (2020.01); *H01M 2220/30* (2013.01)

(58) Field of Classification Search
CPC .. H01M 10/48; H01M 10/44; H01M 2220/30; A24F 40/53; A24F 40/60; H02J 7/005
See application file for complete search history.

(56) References Cited

U.S. PATENT DOCUMENTS

2014/0345635 A1* 11/2014 Rabinowitz .......... A24B 15/167
131/352
2015/0374040 A1* 12/2015 Chen ...................... G01R 31/66
131/328
(Continued)

FOREIGN PATENT DOCUMENTS

CN 101800340 A 8/2010
CN 202980149 U 6/2013
(Continued)

*Primary Examiner* — Alexander Satanovsky
*Assistant Examiner* — Sharah Zaab
(74) *Attorney, Agent, or Firm* — Proi Intellectual Property US (57) ABSTRACT

A battery health monitoring method and apparatus, and an electronic cigarette. The battery health monitoring method comprises: a control unit acquiring, according to the state of a battery, information of the battery from a detection unit; the control unit determining, based on the information of the battery, whether the battery is abnormal; and if the battery is abnormal, the control unit controlling an electronic cigarette, such that same sends an alarm signal and/or controlling the battery, such that same stops working. By means of the method, an abnormal battery in an electronic cigarette can be discovered in a timely manner, thereby avoiding damage occurring to the electronic cigarette.

15 Claims, 3 Drawing Sheets (51) Int. Cl.
*A24F 40/60* (2020.01)
*H01M 10/44* (2006.01)
*H02J 7/00* (2006.01)

(56) References Cited

U.S. PATENT DOCUMENTS

2016/0106156 A1* 4/2016 Qiu .................... H02J 7/00712
   392/404
2017/0250552 A1* 8/2017 Liu ....................... H01M 10/46

FOREIGN PATENT DOCUMENTS

| | | | |
|---|---|---|---|
| CN | 104835987 A | 8/2015 | |
| CN | 205052868 U | 3/2016 | |
| CN | 105576730 A | 5/2016 | |
| CN | 105811531 A | 7/2016 | |
| CN | 107647480 A | 2/2018 | |
| CN | 108458804 A | 8/2018 | |
| CN | 108720084 A | 11/2018 | |
| CN | 109619681 A | 4/2019 | |
| WO | 2015003338 A | 1/2015 | |
| WO | 2015013913 A1 | 2/2015 | |
| WO | WO2015013913 * | 2/2015 | ............. A24F 40/90 |
| WO | WO2015058430 * | 4/2015 | ............. A24F 40/53 |
| WO | WO2017185356 * | 11/2017 | ............. A24F 40/53 |
| WO | 2018203044 A1 | 11/2018 | |

* cited by examiner

BATTERY HEALTH MONITORING METHOD AND APPARATUS, AND ELECTRONIC CIGARETTE

This application claims priority to Chinese patent application No. 2018113510975 filed with the Chinese Patent Office on Nov. 14, 2018, entitled "A battery health monitoring method, device and electronic cigarette", the entire contents of which are incorporated by reference in this application.

TECHNICAL FIELD

Embodiments of the present application relate to the technical field of electronic cigarettes, and in particular to a battery health monitoring method, device and electronic cigarette.

BACKGROUND

Electronic cigarette is a product that heats an aerosol substrate such as nicotine through a power supply to produce an aerosol for the user to smoke.

In the electronic cigarette, lithium batteries are usually used as a power supply. However, problems such as short circuit, capacity attenuation, liquid leakage, bulge and so on are very easy to occur due to improper installation and use of lithium batteries. If the lithium batteries are still used when problems occur, it is easy to cause lithium batteries to catch fire or explode.

The inventor discovered in the process of realizing this invention: currently, it is impossible to detect abnormal batteries in electronic cigarettes in a timely manner, making the use of electronic cigarettes having security risks.

SUMMARY

This invention aims to provide a battery health monitoring method, device, and electronic cigarette that can detect abnormal batteries in electronic cigarettes in a timely manner and avoid damage to the electronic cigarette.

To solve the above technical problems, one technical solution used in this embodiment is to provide a battery health monitoring method applied to an electronic cigarette, the electronic cigarette comprising a battery, a detector, and a controller, the detector being connected to the controller, and both the detector and the controller being connected to the battery.

The battery health monitoring method comprising:

the controller acquiring battery information from the detector based on the status of the battery;

the controller determining whether the battery is abnormal based on the battery information;

if the battery is abnormal, the controller controls the electronic cigarette to issue an alarm signal and/or controls the battery to stop working.

Optionally, the state of the battery includes: a working state and an idle state.

Optionally, when said state of the battery enters the idle state from the working state, said controller acquires from said detector a first battery voltage when the battery enters the idle state and acquires a second battery voltage when the battery enters the working state from the idle state.

Optionally, said the step of the controller determines whether the battery is abnormal based on the battery information specifically comprising:

the controller determining an actual voltage drop based on the first battery voltage and the second battery voltage;

the controller determining whether the actual voltage drop is greater than the preset standard voltage drop, and if the actual voltage drop is greater than the preset standard voltage drop, the controller determining that the battery is abnormal.

Optionally, the controller obtains battery information in real time from the detector when the state of the battery is operating, the battery information including: battery temperature, battery voltage and battery operating current.

The controller determines whether the battery is abnormal or not based on the battery information prior to the step of the method further comprising the controller recording in real time the time of acquisition.

Optionally, the controller determines whether the battery is abnormal based on the battery information specifically comprising:

the controller calculating the actual battery charging and discharging capacity based on the battery voltage, the battery operating current and the acquisition time;

the controller determining a standard battery charging and discharging capacity in a predetermined battery model;

the controller determining that the battery is abnormal if at least one of the difference between the actual battery charging and discharging capacity and the standard battery charging and discharging capacity, the battery temperature and the battery operating current is not within the predetermined standard range.

Optionally, the controller calculates the actual battery charging and discharging capacity based on the battery voltage, the battery operating current and the acquisition time specifically comprising:

the controller extracting the third battery voltage and the first battery operating current corresponding to the current acquisition time and the fourth battery voltage and the second battery operating current corresponding to the previous acquisition time;

the controller determining a time interval based on the current acquisition time and the previous acquisition time;

the controller calculating the actual battery charging and discharging capacity based on the time interval, the third battery voltage, the fourth battery voltage, the first battery operating current, and the second battery operating current.

Optionally, the controller determines a standard battery charging and discharging capacity in the predetermined battery model based on the third battery voltage and the fourth battery voltage.

To solve the above technical problems, another technical solution adopted in this embodiment is: to provide a battery health monitoring device, applied to an electronic cigarette, the electronic cigarette includes a battery, a detector and a controller, the detector is connected to the controller, and both the detector and the controller are connected to the battery.

The battery health monitoring device comprises:

an acquisition module for acquiring battery information from the detector based on status of the battery;

a determination module for determining whether the battery is abnormal based on the battery information;

a control module for controlling the electronic cigarette to issue an alarm signal and/or controlling the battery to stop working when the battery is abnormal.

Optionally, the battery state includes: a working state and an idle state.

Optionally, the acquiring module is specifically used to obtain from the detector a first battery voltage when the battery enters the idle state and obtain a second battery voltage when the battery enters the working state from the idle state when the state of the battery enters the idle state from the working state.

Optionally, the determination module comprises:

a first determination module for determining the actual voltage drop based on the first battery voltage and the second battery voltage;

a second determination module for determining whether the actual voltage drop is greater than a preset standard voltage drop, and if the actual voltage drop is greater than the preset standard voltage drop, the controller determines that the battery is abnormal.

Optionally, the obtaining module is specifically used to obtain battery information in real time from the detector when the state of the battery is working, the battery information comprising: battery temperature, battery voltage and battery operating current.

The battery health monitoring device further comprises:

a recording module for recording the acquisition time in real time before determining whether the battery is abnormal based on the battery information.

Optionally, the determination module comprises:

a first calculation module for calculating the actual battery charging and discharging capacity based on the battery voltage, the battery operating current, and the acquisition time;

a third determination module for determining a standard battery charging and discharging capacity in a predetermined battery model;

a fourth determination module for determining that the battery is abnormal if at least one of the difference between the actual battery charging and discharging capacity and the standard battery charging and discharging capacity, the battery temperature and the battery operating current is not within the predetermined standard range.

Optionally, the first calculation module comprises:

an extraction module for extracting a third battery voltage and a first battery operating current corresponding to the current acquisition time and a fourth battery voltage and a second battery operating current corresponding to the previous acquisition time;

a fifth determination module for determining a time interval based on the current acquisition time and the previous acquisition time;

a second calculation module for calculating the actual battery charging and discharging capacity based on the time interval, the third battery voltage, the fourth battery voltage, the first battery operating current, and the second battery operating current.

Optionally, the third determination module is specifically used to determine a standard battery charging and discharging capacity in the predetermined battery model based on the third battery voltage and the fourth battery voltage.

In order to solve the above technical problems, another technical solution used in this embodiment is: to provide an electronic cigarette comprising:

a battery;

a detector, the detector being connected to the battery for collecting battery information of the battery; and a controller, the controller being connected to the battery and the detector, the controller comprising at least one processor, and a memory communicatively connected to the at least one processor, wherein the memory stores instructions executable by the at least one processor, the instructions being executed by the at least one processor to enable the at least one processor to perform the method described above.

Optionally, the detector is an analog detection circuit or a power meter.

To solve the above technical problem, another technical solution used in this embodiment is to provide a non-volatile computer readable storage medium, the non-volatile computer readable storage medium storing computer-executable instructions, the computer-executable instructions for causing an electronic cigarette to perform the method described above.

The beneficial effect of this invention is that, different from the prior art, this invention provides a battery health monitoring method, a device, and an electronic cigarette. In which the battery health monitoring method, after the controller obtains battery information from the detector based on the state of the battery, it can determine whether the battery is abnormal based on the battery information, enabling the electronic cigarette to detect abnormal batteries in a timely manner, and when an abnormal battery is detected, the electronic cigarette can be controlled to send an alarm signal and/or control the battery to stop working, preventing the continued use of abnormal batteries from causing safety hazards, effectively avoiding damage to the electronic cigarette.

BRIEF DESCRIPTION OF THE DRAWINGS

One or more embodiments are illustrated exemplarily by means of pictures in the accompanying drawings corresponding thereto; these exemplary illustrations do not constitute a limitation of the embodiments, and elements in the accompanying drawings having the same reference numerical designation are indicated as similar elements, and the drawings in the accompanying drawings do not constitute a limitation of scale unless specifically stated.

DETAILED DESCRIPTION OF THE EMBODIMENTS

In order to make the purpose, technical solutions and advantages of the embodiments of the present application clearer, the technical solutions in the embodiments of the present application will be described clearly and completely below in conjunction with the accompanying drawings in the embodiments of the present application, and it is clear that the embodiments described are a part of the embodiments of the present application and not all of them. Based on the embodiments in the present application, all other embodiments obtained by a person of ordinary skill in the art without making creative labor fall within the scope of protection of the present application.

It is noted that when an element is represented as "fixed" to another element, it may be directly on the other element, or one or more centered elements may be present therebetween. When an element is represented as "attached" to another element, it may be directly attached to the other element, or one or more centered elements may be present therebetween. The terms "vertical", "horizontal", "left", "right", and similar expressions used in this specification are for illustrative purposes only. expressions are for illustrative purposes only.

In addition, the technical features involved in the various embodiments of the present application described below can be combined with each other as long as they do not constitute a conflict between them.

Embodiment 1

Figure 1:
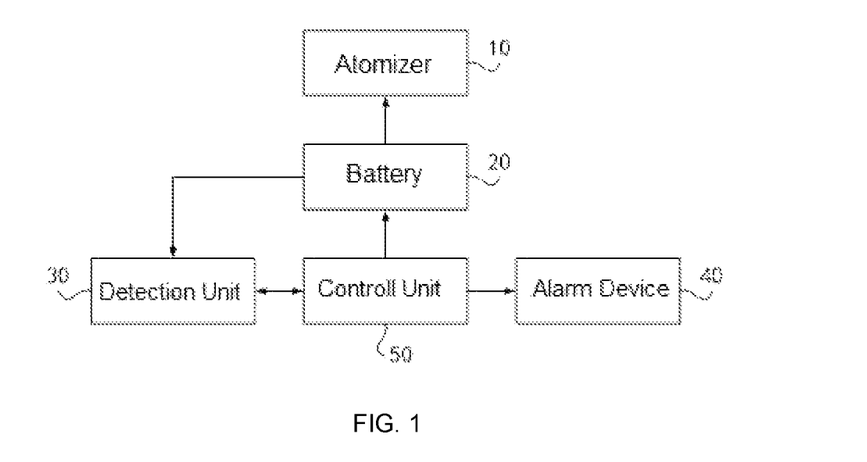
FIG. 1 is a schematic diagram of the structure of an electronic cigarette provided by embodiments of the present invention.

Referring to FIG. 1, a schematic diagram of the structure of an electronic cigarette provided by an embodiment of the present application, the electronic cigarette includes: an atomizer 10, a battery 20, a detector 30, an alarm device 40, and a controller 50. The battery 20, the detector 30, and the alarm device 40 are connected to the controller 50, and the atomizer 10 and the detector 30 are connected to the battery 20.

Specifically, the battery 20 is a lithium-ion battery which, when connected to the atomizer 10, is capable of providing electrical energy to the atomizer 10 so that the atomizer 10 can generate heat to heat the aerosol substrate to produce an aerosol based on the electrical energy provided by the battery 20. The battery 20 provides electrical energy to the atomizer 10 i.e. the battery 20 is discharged.

Since lithium-ion batteries are rechargeable and need to be charged by an external power source, in this embodiment, the battery 20 is also connected to a charging circuit (not shown) that is used to connect to an external power source so that the external power source can charge the battery 20.

Since when the battery 20 is charged or discharged, it will make the battery capacity change, so the battery 20 is charged or discharged to determine that the battery 20 is working, and the battery 20 is not charged and not discharged to determine that the battery 20 is idle. That is, the state of the battery 20 includes: a working state and an idle state, and when the battery 20 is charged or discharged, the battery 20 is in the working state; when the battery 20 is not charged and not discharged, the battery 20 is in the idle state.

Further, the battery 20 is further connected to the controller 50, and the controller 50 is used to control the state of the battery 20, including controlling the battery 20 in a working state (i.e., controlling the battery 20 to work), or, controlling the battery 20 in an idle state (i.e., controlling the battery 20 to stop working).

When the controller 50 controls the battery 20 in an working state, the controller 50 controls the battery 20 to power the atomizer 10, or, the controller 50 controls an external power source to charge the battery 20. Wherein, the controller 50 controls the external power supply to charge the battery 20 specifically includes: controlling the charging circuit to close.

When the controller 50 controls the battery 20 in an idle state, the controller 50 controls the battery 20 to stop supplying power to the atomizer 10, or, the controller 50 controls an external power source to stop charging the battery 20. In particular, the controller 50 controls the external power supply to stop charging the battery 20 includes: controlling the charging circuit to disconnect.

In some embodiments, the battery 20 can also be connected to the atomizer 10 via a discharge circuit (not shown), where the controller 50 can control the battery 20 to power the atomizer 10 by controlling the discharge circuit to close so that the battery 20 is in an working state; the controller 50 can control the battery 20 to stop powering the atomizer 10 by controlling the discharge circuit to break so that the battery 20 is in an idle state.

The detector 30 is a power meter or analog detection circuit, which is connected to the battery 20 and can collect the battery information of the battery 20, which includes battery voltage, battery operating current and battery temperature. Among them, the battery operating current includes battery charging current or battery discharge current. When the battery 20 is charging, the battery charging current is collected by the detector 30; when the battery 20 is discharging, the battery discharging current is collected by the detector 30.

Further, the detector 30 is further connected to the controller 50, and the controller 50 is used to obtain battery information from the detector 30 to achieve monitoring of the battery health based on the obtained battery information.

The alarm device 40 can be a vibration motor or a speaker or a buzzer or a display unit or an indicator. When the alarm device 40 is a vibration motor, the vibration motor vibrates to drive the electronic cigarette to vibrate to realize the alarm; when the alarm device 40 is a speaker, the speaker announces a voice message to alert the electronic cigarette to realize the alarm; when the alarm device 40 is a buzzer, the buzzer beeps to alert the electronic cigarette to realize the alarm; when the alarm device 40 is a display unit, the display unit displays the alarm information to realize the alarm; when the alarm device 40 is an indicator, the indicator flashes to alert the electronic cigarette to realize the alarm; and when the alarm device 40 is an indicator, the indicator flashes to realize the alarm. When the alarm device 40 is a display unit, the display unit displays alarm information to realize the alarm; when the alarm device 40 is a light, the light flashes to alert the electronic cigarette to realize the alarm.

The alarm device 40 is connected to the controller 50, and the warning signal is sent by the controller 50 to control the alarm device 40 to realize the warning.

The controller 50 is then used to execute a battery health monitoring method described in this application to enable the electronic cigarette to detect abnormal batteries in a timely manner, and to enable the electronic cigarette to issue an alarm signal and/or control the battery to stop working when abnormal batteries are detected, preventing the continued use of abnormal batteries from causing explosions, fires, and other safety hazards.

First, the controller 50 determines the status of the battery 20.

In this embodiment, when the controller 50 receives a start command, it means that the controller 50 controls the battery 20 to enter the discharging state, and when the controller 50 receives an off command, it means that the controller 50 controls the battery 20 to end the discharging state; when the controller 50 receives a charge command, it means that the controller 50 controls the battery 20 to enter the charging state, and when the controller 50 When the controller 50 receives the end command, it means that the controller 50 controls the battery 20 to end the charging state. Among them, the user presses the start button of the electronic cigarette to generate the start command, and the user presses the close button of the electronic cigarette to generate the close command; when the external power supply is connected to the electronic cigarette, the charge command is generated, and when the external power supply is disconnected from the electronic cigarette, the end command is generated.

Based on this, the controller 50 determines the status of the battery 20 based on the instructions received.

Specifically, in the case of the end of the discharge state as well as the end of the charge state, when the controller 50 receives a start command (or a charge command), the controller 50 determines that the battery 20 enters the working state from the idle state, and if the controller 50 receives a shutdown command (or an end command) at the next moment, the controller 50 determines that the battery 20 enters the idle state from the working state.

In the case of ending the discharge state as well as ending the charge state, when the controller 50 receives a start command (or a charge command), the controller 50 determines that the battery 20 enters the working state from the idle state, and if the controller 50 receives a charge command (or a start command) at the next moment, the controller 50 determines that the battery 20 enters the idle state from the working state only after receiving the shutdown command and the end command.

Further, after the controller 50 determines the status of the battery 20, the controller 50 obtains battery information from the detector 30 based on the determined status.

wherein the step of the controller 50 obtaining battery information from the detector 30 includes: after the detector 30 collects battery information of the battery 20 in real time, the controller 50 obtains the required battery information from the battery information collected by the detector 30 in real time; or, after the controller 50 controls the detector 30 to collect the required battery information from the battery 20, the controller 30 obtains the battery information from the detector 30.

When the controller 50 determines that the state of the battery 20 enters the idle state from the working state, the controller 50 obtains the first battery voltage from the detector 30 when the battery 20 enters the idle state, and obtains the second battery voltage from the detector 30 when the battery 20 enters the working state from the idle state when the state of the battery 20 enters the working state from the idle state again.

When the controller 50 determines that the state of the battery 20 is the working state, the controller 50 obtains battery information in real time from the detector 30, and the battery information obtained includes: the temperature of the battery, the voltage of the battery, and the operating current of the battery.

And when the controller 50 obtains the battery information from the detector 30 in real time, the controller 50 records the time of acquisition in real time, which is the time the controller 50 obtains the battery information from the detector 50.

In some alternative embodiments, when the controller 50 determines that the state of the battery 20 is the working state, the controller 50 is also capable of acquiring the battery information from the detector 30 at predetermined intervals and record the acquisition time.

Further, after the controller 50 obtains the battery information, the controller 50 determines whether the battery 20 is abnormal based on the battery information and controls the electronic cigarette to send an alarm signal and/or control the battery 20 to stop working when the battery 20 is abnormal.

Specifically, after the controller 50 obtains the first battery voltage and the second battery voltage, the controller 50 determines the actual voltage drop based on the first battery voltage and the second battery voltage; then the controller 50 determines whether the battery 20 is abnormal by judging whether the actual voltage drop is greater than the preset standard voltage drop, and if the actual voltage drop is greater than the preset standard voltage drop, the controller 50 determines that the battery 20 is abnormal.

Wherein, the actual voltage drop is the difference between the first battery voltage and the second battery voltage; the preset standard voltage drop is a predetermined fixed value, preferably, the preset standard voltage drop is 0.1V.

After the controller 50 acquires the battery temperature, the battery voltage and the battery operating current in real time and records the acquisition time in real time, the controller 50 calculates the actual battery charging and discharging capacity based on the battery voltage, the battery operating current and the acquisition time; then the controller 50 determines the standard battery charging and discharging capacity in the preset battery model, and determines whether the battery 20 is abnormal by judging whether at least one of the difference between the actual battery charging and discharging capacity and the standard battery charging and discharging capacity, the battery temperature, and the battery operating current is within the preset standard range. If at least one of the difference between the actual battery charging and discharging capacity and the standard battery charging and the discharging capacity, the battery temperature, and the battery operating current is not within the preset standard range, then the controller 50 determines that the battery 20 is abnormal.

wherein the step of the controller 50 calculating the actual battery charging and discharging capacity based on the battery voltage, the battery operating current and the acquisition time specifically comprising: the controller 50 extracts the third battery voltage and the first battery operating current corresponding to the current acquisition time and extracts the fourth battery voltage and the second battery operating current corresponding to the previous acquisition time; after the controller 50 determines a time interval between the current acquisition time and the previous acquisition time, the controller 50 calculates the actual battery charging and discharging capacity based on the time interval, the third battery voltage, the fourth battery voltage, the first battery operating current and the second battery operating current.

Wherein, the time interval is the difference between the current acquisition time and the previous acquisition time. In some embodiments, the time interval is the preset time interval when the controller 50 acquires battery information from the detector 30 and records the acquisition time according to the preset time interval.

The step of calculating the actual battery charging and discharging capacity based on the time interval, the third battery voltage, the fourth battery voltage, the first battery operating current, and the second battery operating current, specifically includes: calculating the actual battery charging and discharging capacity by integration.

The step of the controller 50 determining the standard battery charging and discharging capacity in the predetermined battery model, specifically includes: the controller determines the standard battery charging and discharging capacity in the predetermined battery model based on the third battery voltage and the fourth battery voltage.

Figure 2A:
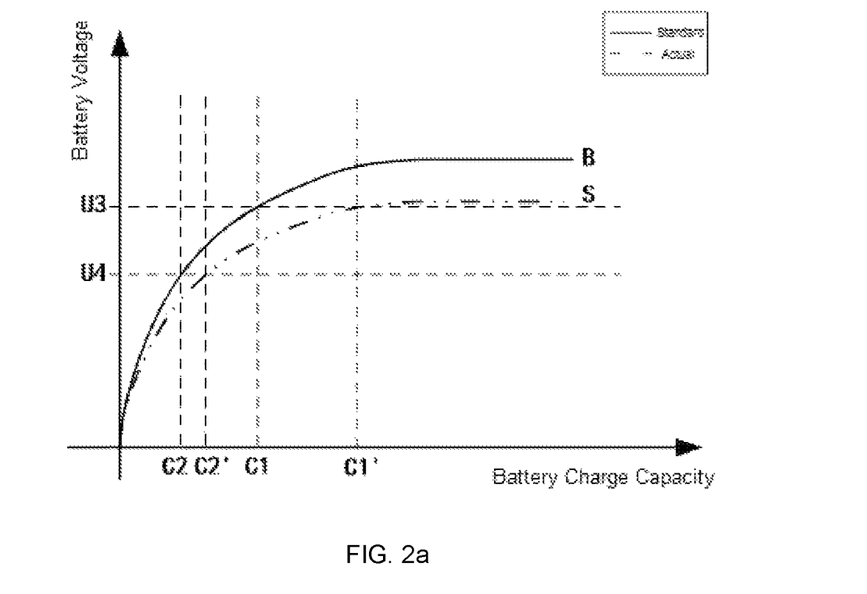
FIG. 2a shows the relationship between the battery charge capacity and the battery voltage for the standard and actual states.
Figure 2B:
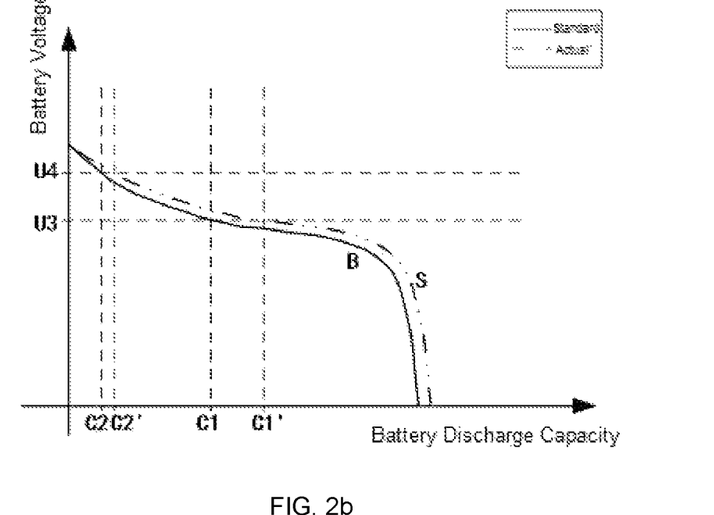
FIG. 2b shows the relationship between the battery discharge capacity and the battery voltage for the standard and actual states.

The preset battery model is the curve of battery charging and discharging capacity with battery voltage (as shown in curve B in FIG. 2a and FIG. 2b). The difference between the battery charging and discharging capacity C1 determined in the preset battery model by the third battery voltage (U3 as shown in FIG. 2a and FIG. 2b) and the battery charging and discharging capacity C2 determined in the preset battery model by the fourth battery voltage (U4 as shown in FIG. 2a and FIG. 2b) is the standard battery charging and discharging capacity during the time interval.

Of course, in some alternative embodiments, the predetermined battery model may also be a curve of the variation of battery voltage with the percentage of battery charging and discharging capacity.

When the difference between the actual battery charging and discharging capacity and the standard battery charging and discharging capacity is greater than the preset difference range, it is determined that the difference between the actual battery charging and discharging capacity and the standard battery charging and discharging capacity is not within the preset standard range; when the battery temperature is less than or greater than the preset standard temperature range, it is determined that the battery temperature is not within the preset standard range; when the battery operating current is less than or greater than the preset standard operating current range, it is determined that the battery operating current is not within the preset standard range. The preset difference range, the preset standard temperature range, and the preset standard operating current range are related to the characteristics of the electronic cigarette and the battery 20.

The step of controlling the electronic cigarette to send an alarm signal and/or control the battery 20 to stop working when the battery 20 is abnormal, specifically includes: the controller 50 controls the electronic cigarette to send an alarm signal; the controller 50 controls the battery 20 to stop working; the controller 50 controls the electronic cigarette to send an alarm signal and control the battery 20 to stop working.

The controller 50 controls the alarm device 40 of the electronic cigarette to send an alarm signal to remind the user that the battery 20 is abnormal, the use of the electronic cigarette should be stopped immediately, and the battery 20 should be replaced. When the alarm device 40 is a vibration motor, the vibration motor is controlled to vibrate; when the alarm device 40 is a speaker, the speaker is controlled to broadcast a voice message; when the alarm device 40 is a buzzer, the buzzer is controlled to beep; when the warning When the alarm device 40 is a display unit, control the display unit to display alarm information; When the alarm device 40 is an indicator, control the indicator to flash.

The step of the controller controlling the battery to stop working including: controlling the battery to stop charging or controlling the battery to stop discharging.

during the idle state, the battery 20 is prohibited from entering the charging process or the discharging process, directly leaving the battery 20 in the idle state.

If the battery 20 is found to be abnormal during the operating condition, the battery 20 is prohibited from further charging or discharging.

This embodiment proposes an electronic cigarette that collects battery information from a battery by setting a detector, so that the controller can obtain battery information from the detector based on the status of the battery and determine whether the battery is abnormal based on the battery information, so that the electronic cigarette can detect abnormal batteries in a timely manner, and when an abnormal battery is detected, it can control the electronic cigarette to send an alarm signal and/or control the battery to stop working. Thus, it can prevent the use of abnormal battery from causing potential safety hazard, and effectively avoid the damage to electronic cigarette.

Embodiment 2

Figure 3:
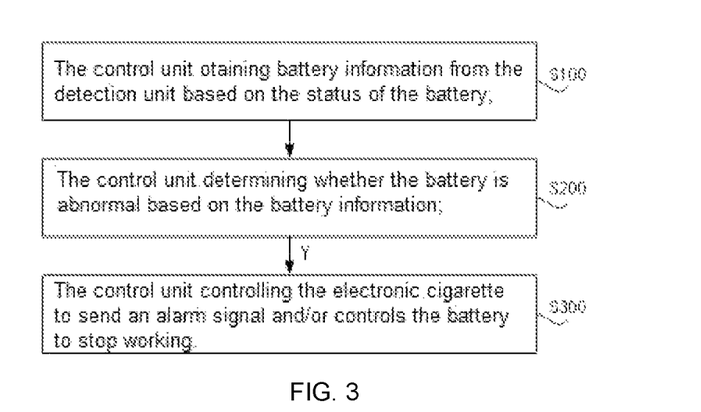
FIG. 3 is a flow diagram of a battery health monitoring method provided by embodiments of the present invention.

Referring to FIG. 3, a flow diagram of a battery health monitoring method provided by an embodiment of the present application, is shown. The flow diagram is applied to an electronic cigarette, the electronic cigarette being the electronic cigarette described in the above embodiment. The method provided by the present embodiment of the present application is executed by the controller 50 described above for monitoring battery health and detecting abnormal batteries in time. The battery health monitoring method includes:

S100: obtains battery information from the detector based on the status of the battery.

The state of the battery includes: a working state and an idle state. When the battery is charged or discharged, the battery is in the working state; when the battery is not charged and not discharged, the battery is in the idle state.

In this embodiment, when the controller receives the start command, it means that the controller controls the battery to enter the discharge state; when the controller receives the shutdown command, it means that the controller controls the battery to end the discharge state; when the controller receives the charge command, it means that the controller controls the battery to enter the charge state; when the controller receives the end command, it means that the controller controls the battery to end the charge state. Thus, the controller can determine the state of the battery according to the received command.

Specifically, in the case of the end-discharge state as well as the end-charge state, when the controller receives a start command (or a charge command), the controller determines that the battery enters the working state from the idle state, and if the controller receives an off command (or an end command) at the next moment, the controller determines that the battery enters the idle state from the working state.

In the case of ending the discharge state as well as ending the charge state, when the controller receives a start command (or a charge command), the controller determines that the battery goes from the idle state to the working state, and if the controller receives a charge command (or a start command) at the next moment, the controller determines that the battery goes from the working state to the idle state only after receiving a shutdown command and an end command.

When the controller determines that the battery enters the idle state from the working state, the controller obtains from the detector the first battery voltage when the battery enters the idle state, and when the battery enters the working state from the idle state, the controller obtains from the detector the second battery voltage when the battery enters the working state from the idle state again.

When the controller determines that the state of the battery is the working state, the controller obtains battery information from the detector in real time. The battery information obtained includes: battery temperature, battery voltage and battery operating current.

And when the controller obtains the battery information from the detector in real time, the controller records the time of acquisition in real time, which is the time for the controller to obtain the battery information from the detector.

In some alternative embodiments, when the controller determines that the state of the battery is the working state, the controller is capable of obtaining battery information from the detector at predetermined time intervals and record the time of the acquisition.

Wherein, the battery information is collected by the detector, and the step of the controller obtaining the battery information from the detector includes: after the detector collects the battery information of the battery in real time, the controller obtains the required battery information from the battery information collected by the detector in real time; or, after the controller controls the detector to collect the required battery information from the battery, it obtains the battery information collected by the detector from the detector.

S200: determining whether the battery is abnormal based on the battery information.

S300: If the battery is abnormal, the controller controls the electronic cigarette to send an alarm signal and/or controls the battery to stop working.

When the controller obtains the first battery voltage and the second battery voltage, the controller determines the actual voltage drop according to the first battery voltage and the second battery voltage; then the controller determines whether the battery is abnormal by judging whether the actual voltage drop is greater than the preset standard voltage drop, and if the actual voltage drop is greater than the preset standard voltage drop, the controller determines that the battery is abnormal.

Wherein, the actual voltage drop is the difference between the first battery voltage and the second battery voltage; the preset standard voltage drop is a predetermined fixed value, preferably, the preset standard voltage drop is 0.1V.

After the controller acquires the battery temperature, battery voltage and battery operating current in real time and records the acquisition time in real time, the controller calculates the actual battery charging and discharging capacity based on the battery voltage, the battery operating current and the acquisition time; then the controller determines the standard battery charging and discharging capacity in the preset battery model, and judges whether at least one of the difference between the actual battery charging and discharging capacity and the standard battery charging and discharging capacity, the battery temperature, and the battery operating current is not within the preset standard range. If at least one of the difference between the actual battery charging and discharging capacity and the standard battery charging and discharging capacity, the battery temperature, and the battery operating current is not within the preset standard range, the controller determines that the battery is abnormal.

wherein the step of the controller calculating the actual battery charging and discharging capacity based on the battery voltage, the battery operating current and the acquisition time specifically includes: the controller extracts the third battery voltage and the first battery operating current corresponding to the current acquisition time, and extracts the fourth battery voltage and the second battery operating current corresponding to the previous acquisition time; then the controller determines the time interval based on the current acquisition time and the previous acquisition time after calculate the actual battery charging and discharging capacity according to the time interval, the third battery voltage, the fourth battery voltage, the first battery operating current and the second battery operating current.

Wherein, the time interval is the difference between the current acquisition time and the previous acquisition time. In some embodiments, the time interval is the preset time interval when the controller acquires battery information from the detector and records the acquisition time according to the preset time interval.

The step of Calculating the actual battery charging and discharging capacity based on the time interval, the third battery voltage, the fourth battery voltage, the first battery operating current, and the second battery operating current, specifically includes: calculating the actual battery charging and discharging capacity by integration.

The step of the controller determining the standard battery charging and discharging capacity in the preset battery model, specifically includes: the controller determines the standard battery charging and discharging capacity in the preset battery model based on the third battery voltage and the fourth battery voltage.

The preset battery model is the curve of battery charging and discharging capacity with battery voltage (curve B as shown in FIG. 2a and FIG. 2b). The difference between the battery charging and discharging capacity C1 determined in the preset battery model by the third battery voltage (U3 as shown in FIG. 2a and FIG. 2b) and the battery charging and discharging capacity C2 determined in the preset battery model by the fourth battery voltage (U4 as shown in FIG. 2a and FIG. 2b) is the standard battery charging and discharging capacity during the time interval.

Of course, in some alternative embodiments, the predetermined battery model may also be a change curve of battery voltage with the percentage of battery charging and discharging capacity.

When the difference between the actual battery charging and discharging capacity and the standard battery charging and discharging capacity is greater than the preset difference range, it is determined that the difference between the actual battery charging and discharging capacity and the standard battery charging and discharging capacity is not within the preset standard range; when the battery temperature is less than or greater than the preset standard temperature range, it is determined that the battery temperature is not within the preset standard range; when the battery operating current is less than or greater than the preset standard operating current range, it is determined that the battery operating current is not within the preset standard range. The preset difference range, the preset standard temperature range, and the preset standard operating current range are related to the characteristics of the electronic cigarette and the battery.

The step of controlling the electronic cigarette to send an alarm signal and/or control the battery to stop working when the battery is abnormal specifically includes: the controller controls the electronic cigarette to send an alarm signal; the controller controls the battery to stop working; the controller controls the electronic cigarette to send an alarm signal and control the battery to stop working.

The controller controls the alarm device of the electronic cigarette to send an alarm signal to remind the user that the battery is abnormal and that the user should immediately stop using the electronic cigarette and replace the battery. When the alarm device is a vibration motor, the vibration motor is controlled to vibrate; when the alarm device is a speaker, the speaker is controlled to broadcast a voice message; when the alarm device is a buzzer, the buzzer is controlled to beep; when the alarm device is a display unit, the display unit is controlled to display warning information; when the alarm device is an indicator, the indicator is controlled to flash.

The step of the controller controlling the battery to stop working includes: controlling the battery to stop charging or controlling the battery to stop discharging. Since the battery is connected to the external power supply through the charging circuit when charging, the battery is controlled to stop charging by controlling the disconnection of the charging circuit.

In some embodiments, when the battery is discharged, it is connected with the atomizer through the discharge circuit, and then the battery can be controlled to stop discharging by controlling the discharge circuit to be disconnected.

If the battery is found to be abnormal in the idle state, the battery is prohibited from entering the charging process or discharging process, which directly makes the battery in the idle state.

If the battery is found to be abnormal during the operating condition, the battery is prohibited from further charging or discharging.

This embodiment proposes a battery health monitoring method that can obtain battery information from a detector based on the status of the battery and determine whether the battery is abnormal based on the battery information, so that the electronic cigarette can detect abnormal batteries in a timely manner. When an abnormal battery is detected, it can control the electronic cigarette to send an alarm signal and/or control the battery to stop working. Thus, it can prevent the use of abnormal battery from causing potential safety hazard, and effectively avoid the damage to electronic cigarette.

Embodiment 3

Figure 4:
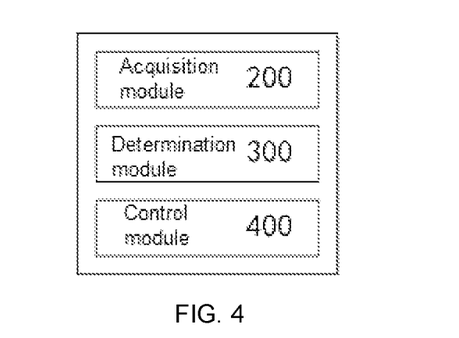
FIG. 4 is a schematic diagram of the structure of a battery health monitoring device provided by embodiments of the present invention.

Referring to FIG. 4, a schematic diagram of the structure of a battery health monitoring device provided by an embodiment of the present invention, is shown. The battery health monitoring device is applied to an electronic cigarette, and the electronic cigarette is the electronic cigarette described in the above embodiment. The functions of the various modules of the device provided by the embodiment of the present invention are performed by the above controller 50, which is for monitoring battery health and detecting abnormal batteries in a timely manner. The battery health monitoring device includes:

an acquisition module 200, the acquisition module 200 being used to obtain battery information from the detector based on the status of the battery.

a determination module 300, the determination module 300 being configured for determining whether the battery is abnormal based on the battery information.

a control module 400, the control module 400 is used to control the electronic cigarette to send an alarm signal and/or control the battery to stop working when the battery is abnormal.

In some embodiments, the acquisition module 200 is specifically used to:

when the battery enters the idle state from the working state, the first battery voltage is obtained from the detector when the battery enters the idle state, and the second battery voltage is obtained when the battery enters the working state from the idle state.

Figure 5:
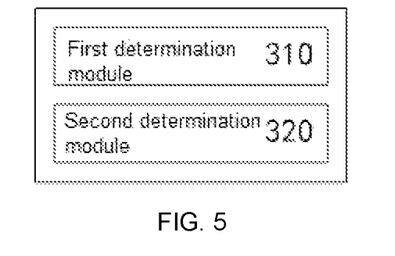
FIG. 5 is a schematic diagram of the structure of one embodiment of the determination module shown in FIG. 4.

Referring to FIG. 5, in some embodiments, the determination module 300 includes:

a first determination module 310, the first determination module 310 for determining the actual voltage drop based on the first battery voltage and the second battery voltage.

a second determination module 320, the second determination module 320 for determining whether the actual voltage drop is greater than a preset standard voltage drop, if the actual voltage drop is greater than the preset standard voltage drop, the controller determines that the battery is abnormal.

In other embodiments, the acquisition module 200 is specifically used to:

when the state of the battery is the working state, the battery information is obtained in real time from the detector, the battery information includes: battery temperature, battery voltage and battery operating current.

At this point, the battery health monitoring device further comprises:

a recording module (not shown), the recording module is used to record the acquisition time in real time.

Figure 6:
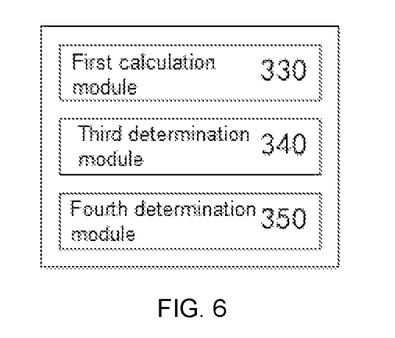
FIG. 6 is a schematic diagram of the structure of another embodiment of the determination module shown in FIG. 4.

Referring to FIG. 6, in some embodiments, the determination module 300 comprises:

a first calculation module 330, the first calculation module 330 is for calculating the actual battery charging and discharging capacity based on the battery voltage, the battery operating current, and the acquisition time;

a third determination module 340, the third determination module 340 is for determining a standard battery charging and discharging capacity in a predetermined battery model;

a fourth determination module 350, the fourth determination module 350 is used to determine that the battery is abnormal if at least one of the difference between the actual battery charging and discharging capacity and the standard battery charging and discharging capacity, the battery temperature, and the battery operating current is not within a predetermined standard range.

Figure 7:
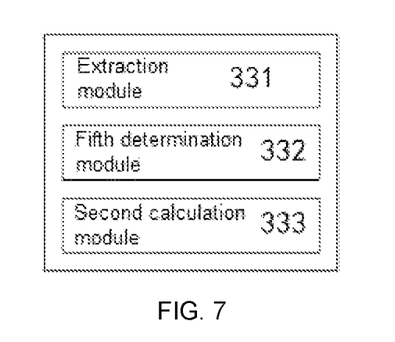
FIG. 7 is a schematic diagram of the structure of the first calculation module shown in FIG. 6.

Referring to FIG. 7, in some embodiments, the first calculation module 330 comprises:

an extraction module 331, the extraction module 331 is for extracting the third battery voltage and the first battery operating current corresponding to the current acquisition time, and the fourth battery voltage and the second battery operating current corresponding to the previous acquisition time;

a fifth determination module 332, the fifth determination module 332 is used to determine a time interval based on the current acquisition time and the previous acquisition time.

a second calculation module 333, the second calculation module 333 is used to calculate the actual battery charging and discharging capacity based on the time interval, the third battery voltage, the fourth battery voltage, the first battery operating current, and the second battery operating current.

In some embodiments, the third determination module 340 is specifically used to:

determining a standard battery charging and discharging capacity in the predetermined battery model based on the third battery voltage and the fourth battery voltage.

Since the device embodiment and the method embodiment are based on the same idea, on the premise that the contents do not conflict with each other, the contents of the device embodiment can be referenced to the method embodiment, which will not be repeated here.

This embodiment proposes a battery health monitoring device that can obtain battery information from a detector based on the status of the battery, and determine whether the battery is abnormal based on the battery information, so that the electronic cigarette can detect abnormal batteries in a timely manner. When an abnormal battery is detected, it can control the electronic cigarette to send an alarm signal and/or control the battery to stop working, thus preventing the use of abnormal battery from causing potential safety hazard, and effectively avoiding the damage to electronic cigarette.

Embodiment 4

Figure 8:
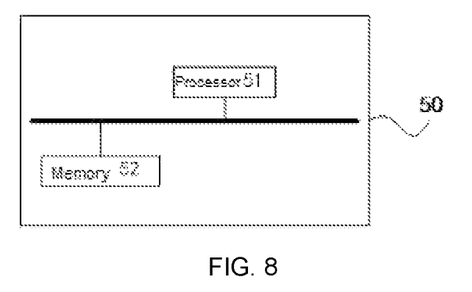
FIG. 8 is a schematic diagram of the hardware structure of a controller provided by an embodiment of the present invention.

Referring to FIG. 8, a schematic diagram of the hardware structure of a controller provided by an embodiment of the present application, is shown. The controller is the controller 50 described in the above embodiment. The hardware module provided by the embodiment of the present application is mainly integrated in the controller, enabling the controller to execute a battery health monitoring method described in the above embodiment, and also to implement the functions of each module of the battery health monitoring device according to the above embodiment.

As shown in FIG. 8, this controller 50 includes:

One or more processors 51 and a memory 52. One processor 51 is used as an example in FIG. 8.

The processor 51 and the memory 52 can be connected via the bus or other ways, with the connection via the bus being illustrated as an example in FIG. 8.

The memory 52, as a non-volatile computer-readable storage medium, can be used to store non-volatile software programs, non-volatile computer-executable programs, and modules, such as program instructions corresponding to a battery health monitoring method and modules corresponding to a battery health monitoring device (e.g., the acquisition module 200, the determination module 300, and the control module 400, etc.) in the above-described embodiment of the present invention. The processor 51 executes various functional applications of a battery health monitoring method and data processing by running the non-volatile software programs, instructions, and modules stored in the memory 52, i.e., realizing a battery health monitoring method in the above method embodiment and the functions of various modules of the above device embodiment.

The memory 52 may include a program storage area and a data storage area, wherein the program storage area may store an operating system, an application program required for at least one function; and the data storage area may store data created based on the use of a battery health monitoring device, etc.

The data storage area also stores preset data, including preset battery model, preset standard voltage drop, preset differential range, preset standard temperature range, preset standard operating current range, etc.

In addition, the memory 52 may include a high-speed random access memory, and may also include non-volatile memory, such as at least one disk memory device, flash memory device, or other non-volatile solid state memory device. In some embodiments, the memory 52 optionally includes a memory that is remotely located relative to the processor 51, and these remote memories may be connected to processor 51 via a network. Examples of the networks include, but are not limited to, the Internet, corporate intranets, local area networks, mobile communication networks, and combinations thereof.

The program instructions and one or more modules are stored in the memory 52 and, when executed by the one or more processors 51, perform the individual steps of a battery health monitoring method in any of the above method embodiments, or, alternatively, implement the individual modules of a battery health monitoring device in any of the above device embodiments.

The above product can execute the method provided in the above embodiment of the present invention, having the functional module and beneficial effect corresponding to the execution method. Technical details not described in detail in this embodiment can be found in the method provided in the above embodiment of this invention.

Embodiments of the present application further provide a non-volatile computer readable storage medium, and the computer readable storage medium stores computer executable instructions. The computer executable instructions can be executed by one or more processors, such as a processor 51 in FIG. 8, so that the computer performs various steps of a battery health monitoring method of any of the above method embodiments, or, alternatively, to implement various modules of any of the above device embodiment of a battery health monitoring device.

Embodiments of the present application further provide a computer program product, the computer program product comprising a computer program stored on a non-volatile computer readable storage medium. The computer program comprises program instructions that, when the program instructions are executed by one or more processors, such as a processor 51 in FIG. 8, cause the computer to perform the various steps of a battery health monitoring in any of the method embodiments described above various steps of the method, or, alternatively, to implement various modules of a battery health monitoring device of the above-described embodiment of any device.

The above described embodiments of the device are merely schematic, wherein the modules described as separate components illustrated may or may not be physically separated, and the components shown as modules may or may not be physical units, i.e., they may be located in one place or may be distributed to a plurality of network units. Some or all of these modules can be selected according to practical needs to achieve the purpose of this embodiment solution.

Through the description of the above embodiments, it is clear to those of ordinary skill in the art that the embodiments may be implemented with the aid of software plus a common hardware platform, or of course, hardware. The person of ordinary skill in the art can understand that the realization of all or part of the process in the method of the above embodiments is possible through computer program instructions related to the hardware, the program can be stored in a computer readable storage medium, the program, when executed, can include the process of implementing the method as described above for each method. Wherein, the storage medium may be a disk, an optical disk, a Read-Only Memory (ROM) or a Random Access Memory (RAM), etc.

The above is only an example of this application and is not intended to limit the scope of this application. Any equivalent structure or equivalent process transformation using the contents of this application and the accompanying drawings, or any direct or indirect application in other related technical fields, is included in the scope of protection of this application.

The invention claimed is:

1. A battery health monitoring method, applicable to an electronic cigarette, wherein said electronic cigarette comprises a battery, a detector, and a controller, said detector connected to said controller, and both said detector and said controller connected to said battery;

wherein said battery health monitoring method comprises the steps of:

said controller acquiring battery information from said detector based on state of said battery; wherein said state of said battery comprises: a working state and an idle state;

said controller determining whether said battery is abnormal based on said battery information; and if said battery is abnormal, said controller controlling said electronic cigarette to issue an alarm signal and/or controlling said battery to stop working wherein when said state of the battery enters the idle state from the working state, said controller acquires from said detector a first battery voltage when the battery enters the idle state and acquires a second battery voltage when the battery enters the working state from the idle state;

and wherein, the step of said controller determines whether said battery is abnormal based on said battery information specifically comprises:

said controller determining an actual voltage drop based on said first battery voltage and said second battery voltage;

said controller determining whether said actual voltage drop is greater than a preset value of voltage drop, and said controller determining that said battery is abnormal if said actual voltage drop is greater than said preset value.

2. The battery health monitoring method according to claim 1, wherein when said battery is the working state, said controller acquires said battery information in real time from said detector, said battery information including:

battery temperature, battery voltage, and battery operating current; and said method further comprise, before the step of said controller determining whether said battery is abnormal based on said battery information, a step of said controller recording the acquisition time in real time.

3. The battery health monitoring method according to claim 2, wherein the step of said controller determining whether said battery is abnormal based on said battery information specifically comprises:

said controller calculating the actual battery charging and discharging capacity based on said battery voltage, said battery operating current and said acquisition time;

said controller determining a standard battery charging and discharging capacity in a preset battery model; and said controller determining that said battery is abnormal if at least one of actual difference between said actual battery charge capacity and said standard battery charge capacity, said battery temperature, and said battery operating current is not within preset criteria.

4. The battery health monitoring method according to claim 3, wherein the step of said controller calculating the actual battery charging and discharging capacity based on said battery voltage, said battery operating current and said acquisition time specifically comprises:

said controller extracting a third battery voltage and a first battery operating current corresponding to the current acquisition time and a fourth battery voltage and a second battery operating current corresponding to a previous acquisition time;

said controller determining a time interval based on said current acquisition time and said previous acquisition time;

said controller calculating the actual battery charging and discharging capacity based on said time interval, said third battery voltage, said fourth battery voltage, said first battery operating current, and said second battery operating current.

5. The battery health monitoring method according to claim 4, wherein said controller determines a standard battery charging and discharging capacity in said predetermined battery model based on said third battery voltage and said fourth battery voltage.

6. A battery health monitoring device, applicable to an electronic cigarette, wherein said electronic cigarette comprises a battery, a detector, and a controller, said detector connected to said controller, and both said detector and said controller connected to said battery;

wherein said battery health monitoring device comprises:

an acquisition module for acquiring battery information from said detector based on state of said battery, wherein said state of said battery comprises: a working state and an idle state; and wherein when said state of the battery enters the idle state from the working state, said acquisition module acquires from said detector a first battery voltage when the battery enters the idle state and acquires a second battery voltage when the battery enters the working state from the idle state;

a determination module for determining whether said battery is abnormal based on said battery information; wherein, said determination module determines an actual voltage drop based on said first battery voltage and said second battery voltage; and determines that said battery is abnormal if said actual voltage drop is greater than a preset value of voltage drop; and a control module for, when said battery is abnormal, controlling said electronic cigarette to issue an alarm signal and/or controlling said battery to stop working.

7. An electronic cigarette comprising:

a battery;

a detector, said detector connected to said battery for collecting battery information of said battery; and a controller, said controller connected to said battery and said detector, said controller comprising at least one processor, and, a memory communicatively connected to said at least one processor, said memory storing computer instructions executable by said at least one processor to enable said at least one processor to perform the method of claim 1.

8. The electronic cigarette according to claim 7, wherein said detector is an analog detection circuit or a power meter.

9. The electronic cigarette according to claim 7, wherein the state of the battery comprises: a working state and an idle state.

10. The electronic cigarette according to claim 9, wherein when the state of the battery enters the idle state from the working state, the controller acquires from the detector a first battery voltage when the battery enters the idle state and acquires a second battery voltage when the battery enters the working state from the idle state.

11. The electronic cigarette according to claim 10, wherein the step of the controller determines whether the battery is abnormal based on the battery information specifically comprises:

the controller determining an actual voltage drop based on the first battery voltage and the second battery voltage;

the controller determining whether the actual voltage drop is greater than a preset value of voltage drop, and the controller determining that the battery is abnormal if the actual voltage drop is greater than the preset value.

12. The electronic cigarette according to claim 9, wherein when the battery is the working state, the controller acquires the battery information in real time from the detector, the battery information including: battery temperature, battery voltage, and battery operating current; and the method further comprise, before the step of the controller determining whether the battery is abnormal based on the battery information, a step of the controller recording the acquisition time in real time.

13. The electronic cigarette according to claim 12, wherein the step of said controller determining whether said battery is abnormal based on said battery information specifically comprises: said controller calculating the actual battery charging and discharging capacity based on said battery voltage, said battery operating current and said acquisition time;

said controller determining a standard battery charging and discharging capacity in a preset battery model; and said controller determining that said battery is abnormal if at least one of actual difference between said actual battery charge capacity and said standard battery charge capacity, said battery temperature, and said battery operating current is not within preset criteria.

14. The electronic cigarette according to claim 13, wherein the step of said controller calculating the actual battery charging and discharging capacity based on said battery voltage, said battery operating current and said acquisition time specifically comprises:

said controller extracting a third battery voltage and a first battery operating current corresponding to the current acquisition time and a fourth battery voltage and a second battery operating current corresponding to a previous acquisition time;

said controller determining a time interval based on said current acquisition time and said previous acquisition time;

said controller calculating the actual battery charging and discharging capacity based on said time interval, said third battery voltage, said fourth battery voltage, said first battery operating current, and said second battery operating current.

15. The electronic cigarette according to claim 14, wherein said controller determines a standard battery charging and discharging capacity in said predetermined battery model based on said third battery voltage and said fourth battery voltage.

* * * * *